United States Patent [19]

Lenaerts et al.

[11] Patent Number: 4,517,739
[45] Date of Patent: May 21, 1985

[54] METHOD FOR MAKING CIRCUIT BOARDS WITH DIE STAMPED CONTACT PADS AND CONDUCTIVE INK CIRCUIT PATTERNS

[75] Inventors: George V. Lenaerts, London; Eugene W. Charchanko, Thorndale; Andrejs Dambenieks, Carp, all of Canada

[73] Assignee: Northern Telecom Limited, Montreal, Canada

[21] Appl. No.: 553,499

[22] Filed: Nov. 21, 1983

[51] Int. Cl.³ .............................................. H05K 3/10
[52] U.S. Cl. ..................................... 29/846; 156/233; 174/68.5
[58] Field of Search ..................... 29/840, 841, 846; 156/233; 339/17 CF; 174/68.5; 428/209

[56] References Cited

U.S. PATENT DOCUMENTS

| | | | |
|---|---|---|---|
| 3,497,410 | 2/1970 | Zagusta | 156/233 |
| 3,547,724 | 12/1970 | Zagusta | 156/233 |
| 3,713,944 | 1/1973 | Dennis et al. | 174/68.5 |
| 3,911,716 | 10/1975 | Weglin | 29/846 X |
| 4,045,636 | 8/1977 | Yoder et al. | 174/68.5 X |
| 4,465,538 | 8/1984 | Schmoock | 29/846 X |

Primary Examiner—Howard N. Goldberg
Assistant Examiner—Carl J. Arbes
Attorney, Agent, or Firm—Sidney T. Jelly

[57] ABSTRACT

Printed circuit boards have copper contact pads cut from copper foil and bonded to the circuit board, followed by printing circuit patterns of conductive ink on the board, the pattern connecting with the contact pads. The contact pads are cut from a copper foil strip fed with the circuit board beneath a die. Bonding of the contact pads follows, then printing of the circuit patterns. Boards can be formed from strip material in which case the individual boards are cut from the strip material.

2 Claims, 7 Drawing Figures

METHOD FOR MAKING CIRCUIT BOARDS WITH DIE STAMPED CONTACT PADS AND CONDUCTIVE INK CIRCUIT PATTERNS

This invention relates to circuit boards with die stamped contact pads and conductive ink circuit patterns, and to a process for making such boards.

Circuit boards are made using techniques such as using porcelainized steel blanks with screened silver inks which are fired; copper patterns on dielectric boards; polymer thick films on dielectric boards. Connections can be made by soldering for the first two examples, while a connector is required for polymer thick films as these are not solderable. For copper patterns on dielectric boards, contact areas are generally produced by plating on to the conductor patterns at desired places.

To reduce the cost it has been proposed to use conventional printed circuit board copper patterns, screen printed with conductive inks at positions where contact pads are required. A further reduction in cost could be obtained by avoiding the preparation of the copper patterns and printing the pattern directly on the board. However, this would require a connector to connect the ink circuitry to components or other boards or devices.

The present invention proposes the die stamping of contact pads on to the dielectric board, at desired locations, followed by screen printing of conductive ink patterns. Typically, a strip of copper is fed over boards; the contact pads are die cut from the copper strip and pressed onto the boards, with the perforated strip wound up; the copper pads are bonded to the boards with heat and pressure; conductive ink patterns are then printed on the boards, connecting with the contact pads. The copper strip hs an adhesive on its lower side and this adhesive is cured by the heating and pressure. While the boards can be singly fed, with suitable locating means, it will usually be more effective to feed the boards in strips, with punching or shearing of finished boards from the strips.

The invention will be readily understood by the following description of typical circuit boards and a process, in conjunction with the accompanying drawings, in which.

Figure 1:
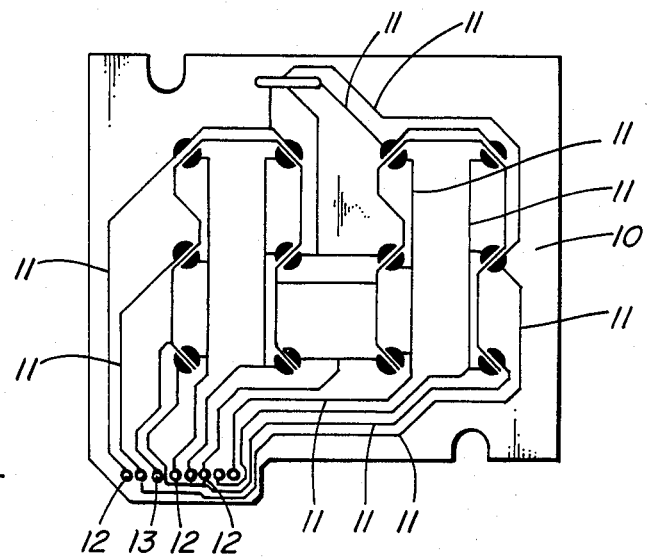
FIGS. 1 and 2 illustrate two typical examples of circuit boards for telephone keypads.
Figure 2:
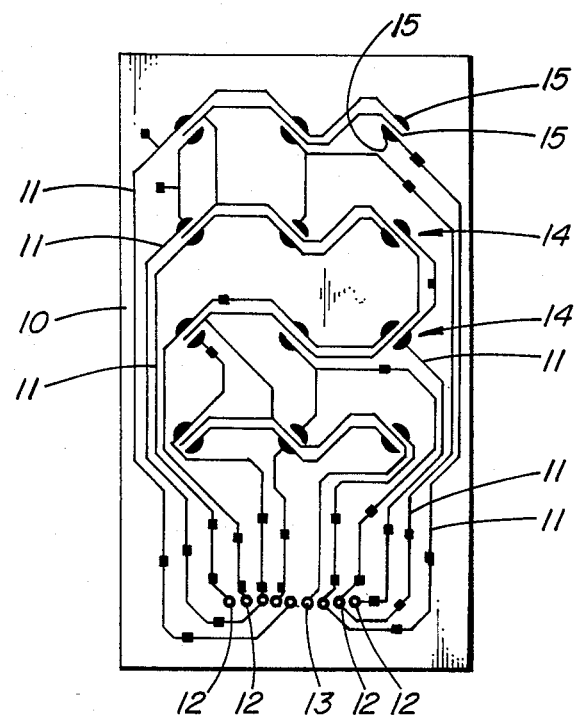

In the circuit boards illustrated in FIGS. 1 and 2, the dielectric base or board is indicated at 10, circuit patterns at 11, formed by copper, with contact pads at 12. The contact pads 12 usually have holes 13 therethrough for reception of pins of a connector, or passage of wires, usually afterwards soldered to the pads 12. Contact areas for push-button keys are formed at 14, as by printing conductive inks at areas indicated at 15. It is often very difficult to obtain accurate register between the conductive ink areas 15 and the copper pattern at those areas. Clearances between the various areas 15 at a position 14 are very small, as are the clearances between the copper areas at these positions and short-circuits can occur.

Figure 3:
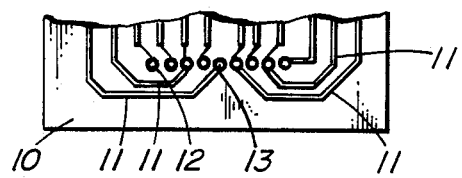
FIG. 3 illustrates a modification to the board of FIG. 2, with enlarged contact pads.

FIG. 3 illustrates a board which is similar to that of FIG. 2, but with contact pads 12 made slightly elongate. The pads are applied by die cutting or stamping from copper film or strips, and the circuit patterns 11 are formed by printed conductive ink. Holes 13 can be provided in die pads 12. The contact areas 14 in FIG. 2 are formed by printing ink on to copper. In a board as in FIG. 3, the contact areas are formed at the same time as the patterns 11 are formed. Thus the need for accurate register between contact areas and conductor patterns is avoided.

Figure 4A:
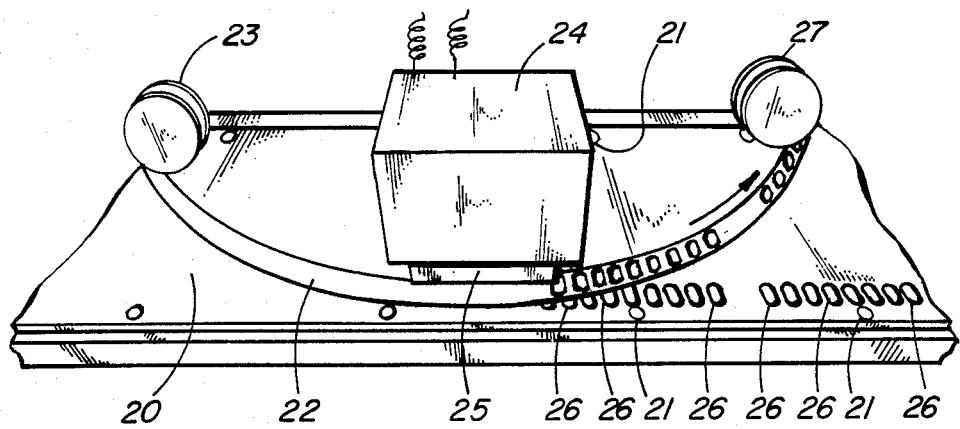
FIGS. 4(a) to 4(d) illustrate the steps in the production of boards, in accordance with the present invention.

A process, or method, of forming circuit boards is illustrated in FIGS. 4(a) to 4(d). In FIG. 4(a), a strip of dielectric material 20 is fed along on a support surface, holes 21 in the strip acting as locating means. A strip of copper foil 22 is fed from a feed roll 23 beneath a press 24 with a die 25. The strip has an adhesive on its lower surface. The die 25, which may be heated, stamps out contact pads from the copper foil and presses them on to the strip 20, the pads seen at 26. The scrap, perforated strip is wound up on a take-up roll 27.

Figure 4B:
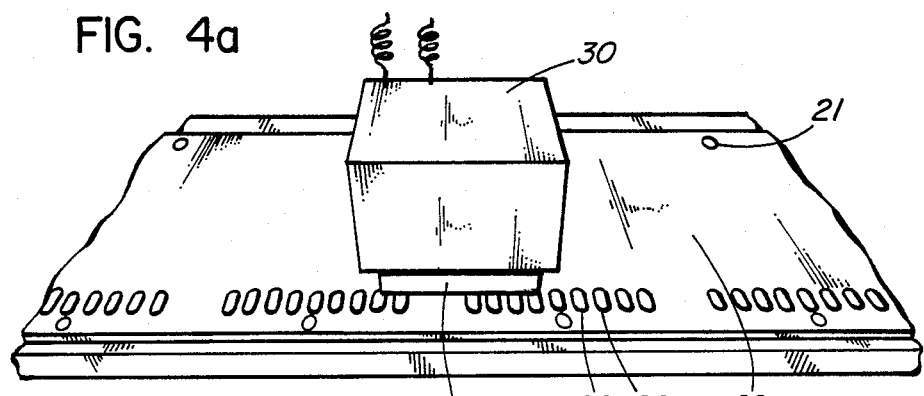
Figure 4C:
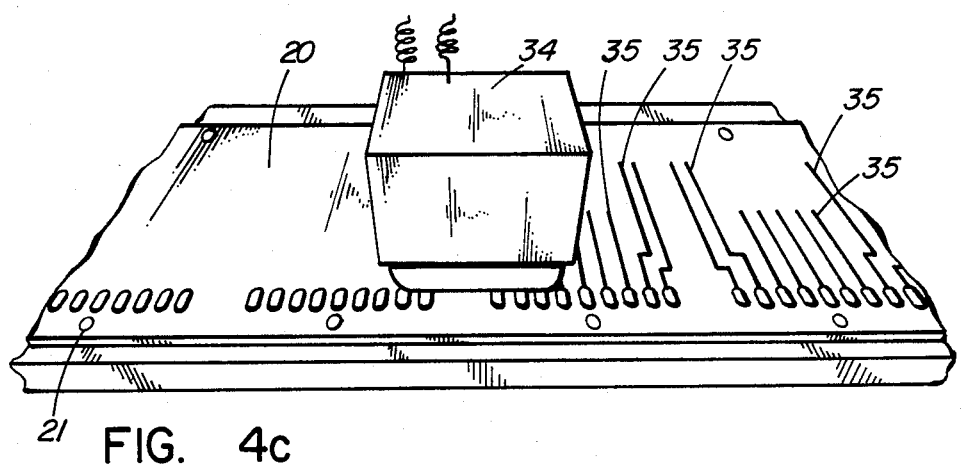
Figure 4D:
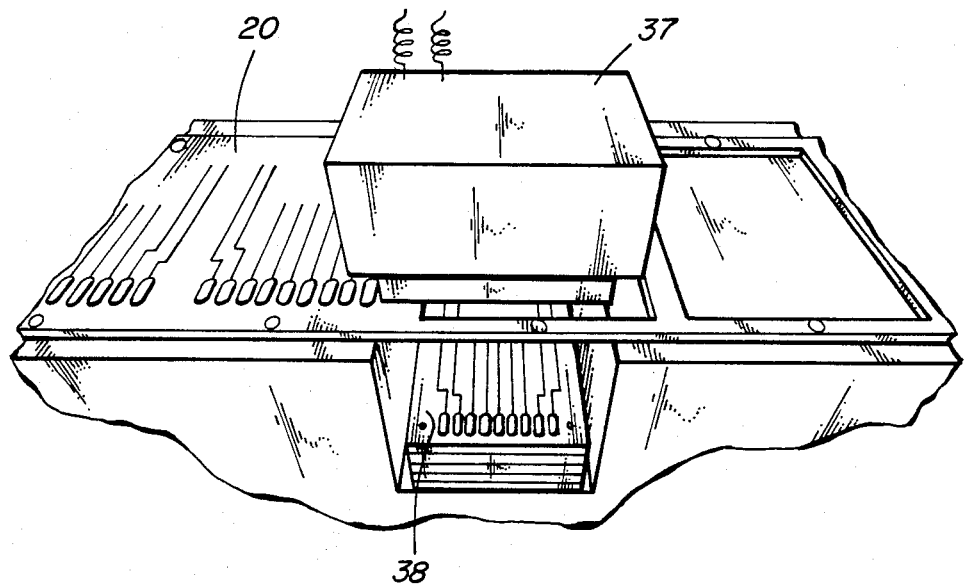

In FIG. 4(b) the strip 20 passes beneath a press 30 having a heated pad 31 which presses on the pads 26 and cures the adhesive. In FIG. 4(c) a printing machine 34 prints the circuit pattern on the strip 20, the circuit patterns indicated at 35. In FIG. 4(d) the strip passes beneath a blanking press 37. The press 37, in addition to blanking out the circuit boards, indicated at 38, can also form any holes required in the circuit board.

The strip of dielectric material is of a length sufficient to produce a predetermined number of circuit boards. The strips are fed beneath the various presses and other apparatus by means of a conventional stepping mechanism which feeds the strip in steps, a step being equal to the pitch of holes 21 for example. The presses 24, 30, and 37 and printing machine 34 are shown electrically operated, the operation being readily controlled by a central control. Thus the strip 20 is moved on pitch, then the various presses and printing machine actuated, then the strip advanced one step, and so on. However, it would be possible to actuate the presses and printing machine hydraulically or pneumatically. The heating pad 31 would normally be heated electrically. If desired, some form of heating of the printed strip, after printing of the circuit pattern, can be provided.

Various advantages result from the invention. The die-press application of the contact pads is simple and accurate. The step of printing the conductive ink circuit patterns is also simple and inexpensive. No very accurate register between the printing of the circuit patterns and the contact pads is required and shorting between adjacent areas of a circuit pattern is avoided. The overall cost is reduced. The scrap from the contact pad forming foil has a high resale value as it is clean and has very little contamination. It is also possible to apply the invention to individual precut circuit boards. It would be necessary to provide the circuit boards with some locating menas, such as holes, to ensure that the individual boards are fed consequtively along beneath the various machines. In this arrangement, the blanking press may not be required, or may be required for forming holes only.

What is claimed is:

1. A method of making circuit boards, comprising:
   feeding a strip of dielectric material along a support surface;
   locating said strip of dielectric material by locating means in said strip;

feeding said strip of dielectric material and a strip of copper foil beneath the die of a press, and actuating said die to stamp contact pads from said foil and press the contact pads on said strip of dielectric material at predetermined positions;

removing the foil strip from the strip of dielectric material;

feeding the strip of dielectric material beneath a press having a heated pad and bonding said contact pads on to said strip of dielectric material, feeding the dielectric strip beneath a printing head and printing a circuit pattern on the dielectric material, the circuit pattern connecting with said contact pads; and feeding the dielectric strip to a press, forming holes through said contact pads and said dielectric material, and cutting individual circuit boards from said strip.

2. A method as claimed in claim 1, said strip of copper foil having a layer of adhesive on its surface in contact with the strip of dielectric material, including pressing the contact pads on to said dielectric material by said die to cause initial adhesion of said contact pads, and curing said adhesive with heat and pressure by said heated pad.

* * * * *